(12) United States Patent
Nakamura (10) Patent No.: US 9,105,516 B2
(45) Date of Patent: Aug. 11, 2015

(54) POLISHING APPARATUS AND POLISHING METHOD

(71) Applicant: EBARA CORPORATION, Tokyo (JP)

(72) Inventor: Akira Nakamura, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 144 days.

(21) Appl. No.: 13/932,062

(22) Filed: Jul. 1, 2013

(65) Prior Publication Data

US 2014/0011305 A1 Jan. 9, 2014

(30) Foreign Application Priority Data

Jul. 3, 2012 (JP) ................................. 2012-149414
Jul. 11, 2012 (JP) ................................. 2012-155204

(51) Int. Cl.
*B24B 49/00* (2012.01)
*H01L 21/66* (2006.01)
*B24B 37/30* (2012.01)

(52) U.S. Cl.
CPC ................ *H01L 22/12* (2013.01); *B24B 37/30* (2013.01)

(58) Field of Classification Search
CPC .... B24B 49/16; B24B 37/013; B24B 37/042; B24B 49/12; B24B 49/00
USPC ............ 451/5, 6, 7, 8, 9, 10, 11, 41, 285–290
See application file for complete search history.

(56) References Cited

U.S. PATENT DOCUMENTS

| | | | |
|---|---|---|---|
| 5,658,190 A * | 8/1997 | Wright et al. | 451/285 |
| 6,325,698 B1 * | 12/2001 | Wada et al. | 451/8 |
| 6,361,648 B1 * | 3/2002 | Tobin | 156/345.1 |
| 7,044,832 B2 | 5/2006 | Yilmaz et al. | |
| 7,445,543 B2 * | 11/2008 | Torii et al. | 451/289 |
| 2001/0012749 A1 * | 8/2001 | Oguri et al. | 451/6 |
| 2002/0094760 A1 * | 7/2002 | Lim | 451/41 |
| 2002/0182978 A1 * | 12/2002 | Lukner et al. | 451/5 |
| 2003/0073381 A1 * | 4/2003 | Mallery et al. | 451/5 |
| 2003/0211812 A1 * | 11/2003 | Isobe et al. | 451/5 |
| 2005/0095811 A1 * | 5/2005 | Koeda et al. | 438/458 |
| 2005/0191947 A1 * | 9/2005 | Chen et al. | 451/41 |
| 2006/0199479 A1 * | 9/2006 | Togawa et al. | 451/59 |
| 2008/0085658 A1 * | 4/2008 | Katsuoka et al. | 451/7 |
| 2008/0146124 A1 * | 6/2008 | Morita | 451/289 |

(Continued)

FOREIGN PATENT DOCUMENTS

| | | |
|---|---|---|
| JP | 2005-123485 A | 5/2005 |
| JP | 2006-303249 A | 11/2006 |

(Continued)

*Primary Examiner* — George Nguyen
(74) *Attorney, Agent, or Firm* — Pearne & Gordon LLP (57) ABSTRACT

A polishing apparatus includes: a polishing table for supporting a polishing pad; a substrate holder having a substrate holding surface and a pressure chamber formed by a flexible membrane, the substrate holder being configured to hold a substrate on the substrate holding surface and press the substrate against the polishing pad via pressure in the pressure chamber; a substrate separation assisting device configured to eject a fluid to a contact portion between the substrate and the flexible membrane so as to release the substrate from the substrate holding surface; and a vertically-moving mechanism configured to vertically move the substrate holder. The substrate holder is moved vertically in accordance with an amount of descent of the contact portion and then the substrate separation assisting device ejects the fluid to the contact portion.

19 Claims, 8 Drawing Sheets

(56) References Cited

U.S. PATENT DOCUMENTS

2009/0061739 A1* 3/2009 Jeong .......................... 451/41
2010/0173566 A1* 7/2010 Paik et al. .................... 451/28
2010/0330788 A1* 12/2010 Yu et al. ...................... 438/514

FOREIGN PATENT DOCUMENTS

| JP | 2009-178800 A | 8/2009 |
| JP | 2010-046756 A | 3/2010 |
| JP | 2011-258639 A | 12/2011 |

* cited by examiner

POLISHING APPARATUS AND POLISHING METHOD

CROSS REFERENCE TO RELATED APPLICATIONS

This document claims priorities to Japanese Patent Application Number 2012-149414, filed Jul. 3, 2012 and Japanese Patent Application Number 2012-155204, filed Jul. 11, 2012, the entire contents of which are hereby incorporated by reference.

BACKGROUND OF THE INVENTION

1. Field of the Invention

The present invention relates to a polishing apparatus and a polishing method, and more particularly to a polishing apparatus and a polishing method for polishing a substrate, such as a wafer.

2. Description of the Related Art

With a recent trend toward higher integration and higher density in semiconductor devices, circuit interconnects become finer and finer and the number of levels in multilayer interconnect is increasing. In the fabrication process of the multilayer interconnect with finer circuit, as the number of interconnect levels increases, film coverage (or step coverage) of step geometry is lowered in thin film formation because surface steps grow while following surface irregularities on a lower layer. Therefore, in order to fabricate the multilayer interconnect, it is necessary to improve the step coverage and planarize the surface. It is also necessary to planarize semiconductor device surfaces so that irregularity steps formed thereon fall within a depth of focus in optical lithography. This is because finer optical lithography entails shallower depth of focus.

Accordingly, the planarization of the semiconductor device surfaces is becoming more important in the fabrication process of the semiconductor devices. Chemical mechanical polishing (CMP) is the most important technique in the surface planarization. This chemical mechanical polishing is a process of polishing a wafer by placing the wafer in sliding contact with a polishing surface of a polishing pad while supplying a polishing liquid containing abrasive grains, such as silica ($SiO_2$), onto the polishing surface.

A polishing apparatus for performing CMP has a polishing table that supports the polishing pad having the polishing surface, and a substrate holder for holding the wafer. The substrate holder is often called a top ring or a polishing head. This polishing apparatus polishes the wafer as follows. The top ring holds the wafer and presses it against the polishing surface of the polishing pad at predetermined pressure. The polishing table and the top ring are moved relative to each other to bring the wafer into sliding contact with the polishing surface to thereby polish a surface of the wafer.

When polishing the wafer, if a relative pressing force applied between the wafer and the polishing pad is not uniform over the surface of the wafer in its entirety, insufficient polishing or excessive polishing would occur depending on the pressing force applied to each portion of the wafer. Thus, in order to even the pressing force exerted on the wafer, the top ring has at its lower part a pressure chamber formed by a flexible membrane (or a membrane). This pressure chamber is supplied with fluid, such as air, to press the wafer against the polishing surface of the polishing pad through the membrane under the fluid pressure.

The above-described polishing pad has elasticity. As a result, the pressing force becomes non-uniform in an edge portion of the wafer during polishing of the wafer. Such non-uniform pressing force would result in so-called "rounded edge" which is excessive polishing that occurs only in the edge portion of the wafer. In order to prevent such rounded edge, the top ring has a retaining ring for retaining the edge portion of the wafer. This retaining ring is configured to be vertically movable relative to a top ring body (or carrier head body) and press a portion of the polishing surface of the polishing pad around the wafer.

A substrate transfer device, which is called a pusher, is disposed near the top ring. This pusher is configured to elevate the wafer, which has been transported by a transporter (e.g., a transfer robot), and transport the wafer to the top ring that has been moved to a position above the pusher. The pusher further has a function to receive the wafer from the top ring and transport the wafer to the transporter (e.g., the transfer robot). The pusher has a substrate detection sensor for detecting the presence of the wafer. When the substrate detection sensor detects the wafer, the pusher performs its next operations.

In the above-discussed polishing apparatus, the wafer, which has been polished on the polishing surface of the polishing pad, is attracted to the top ring via vacuum suction. The top ring is elevated and then the wafer is released from the top ring. This wafer releasing operation is performed by supplying the fluid into the pressure chamber to inflate the membrane so as to separate the wafer from the membrane.

However, since the wafer is separated as a result of deformation of the membrane, a central portion of the wafer may fail to be separated from a corresponding central portion of the membrane which is not deformed greatly. Thus, in order to assist in releasing the wafer from the top ring, a release nozzle (i.e., a substrate separation assisting device) is provided near the pusher. This release nozzle ejects a jet of fluid (release shower) toward a contact portion between the wafer and the membrane to thereby assist the wafer release. Hereinafter, releasing of the wafer in the conventional technique will be described with reference to FIG. 11 and FIG. 12.

Figure 11:
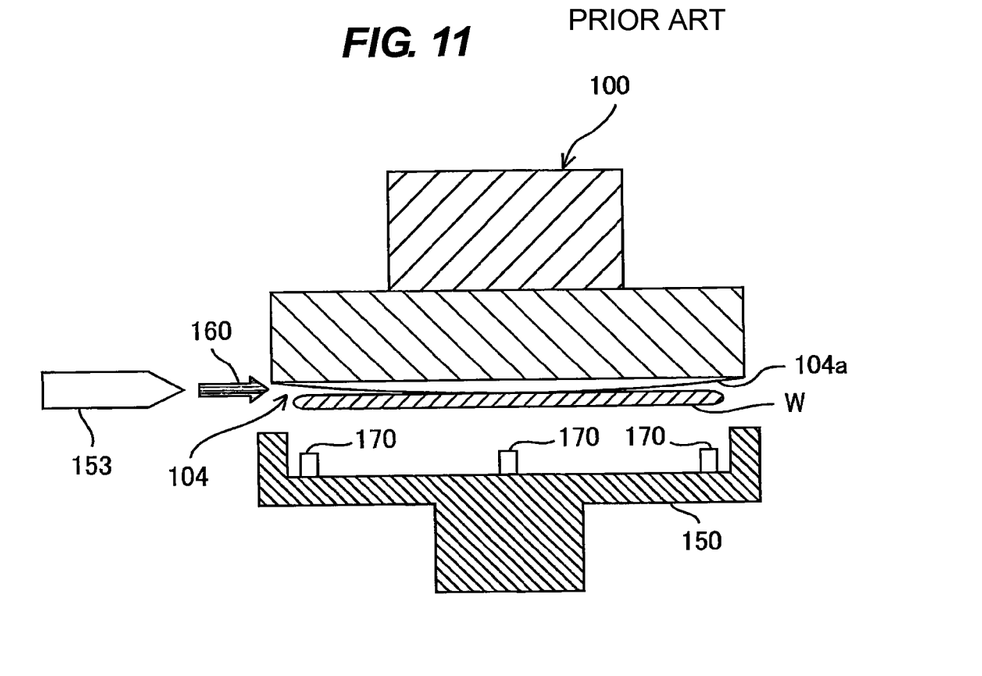
FIG. 11 is a schematic view showing a wafer releasing operation when releasing a wafer from a membrane in a conventional polishing apparatus.

FIG. 11 is a schematic view showing a wafer releasing operation when releasing the wafer from the membrane. As shown in FIG. 11, a membrane 104 is attached to a lower surface of a top ring 100. When a wafer W is transported, the wafer W is held via vacuum suction on a substrate holding surface 104a which is constituted by the membrane 104. FIG. 11 shows a state in which the membrane 104 is inflated so as to release the wafer W therefrom.

A release nozzle 153 for ejecting a jet of a fluid 160 is provided neat the top ring 100. Specifically, the release nozzle 153 is located so as to eject the fluid 160 onto a contact portion between the wafer W and the membrane 104. The fluid 160 may be a fluid mixture of pure water and $N_2$ (nitrogen). When the jet of the fluid 160 impinges on the contact portion between the wafer W and the membrane 104, the wafer W is easily released from the top ring 100.

A substrate detection sensor 170 for detecting the presence of the wafer W is mounted to an upper surface of a pusher 150. When the wafer W is released from the top ring 100 and the wafer W is detected by the substrate detection sensor 170, the pusher 150 is lowered so that the transporter (e.g., the transfer robot) can remove the wafer W from the pusher 150.

Figure 12:
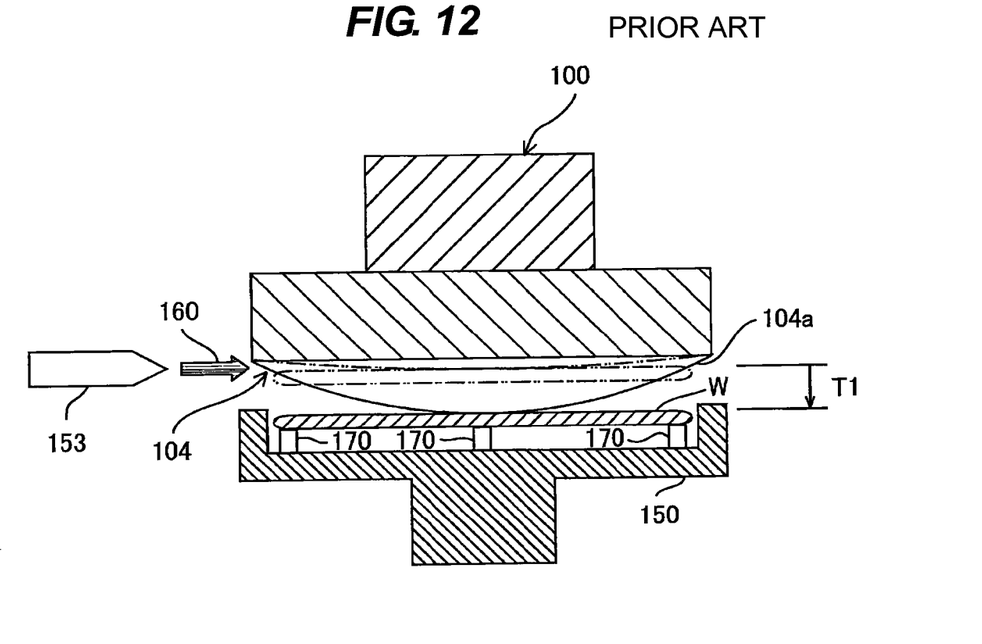
FIG. 12 is a schematic view showing a state in which the membrane is stretched in the conventional polishing apparatus.

FIG. 12 is a schematic view showing a state in which the membrane 104 is stretched. In recent years, the wafer has been becoming heavier with an increase in its diameter, while there is a tendency to use a soft material for the membrane in order to reduce a load on the wafer. Accordingly, when the pressure is supplied into the membrane 104 to inflate it so as to separate the wafer W from the membrane 104, if the central portion of the wafer W remains sticking to the membrane 104, then the membrane 104 is stretched due to the own weight of the wafer W and the inflated membrane 104.

When the membrane 104 is stretched greatly, the contact portion between the wafer W and the membrane 104 is lowered by T1 from a position before the membrane 104 is stretched (this position is indicated by a two-dot chain line). Since the fluid 160 is ejected toward the position that is set before the membrane 104 is stretched, the fluid 160 does not impinge on the contact portion between the wafer W and the membrane 104 (i.e., the position lowered by T1). As a result, it is not possible to quickly release the wafer W.

Moreover, if the membrane 104 is stretched greatly, the substrate detection sensor 170 mounted to the pusher 150 may sense the wafer W that is still sticking to the membrane 104, i.e., may incorrectly detect that releasing of the wafer W is completed. As a result of such a false detection, despite the fact that the wafer W is not released from the membrane 104, the pusher 150 may perform the next operation, causing damage to the wafer W. Therefore, there is a need to improve the process of releasing the wafer W from the membrane 104.

CMP is a process which is likely to produce scrap wafers. There are cases where more than half of the scrap wafers that have been produced in the semiconductor device fabrication come from CMP. In particular, when the wafer is attracted to the top ring by the vacuum suction for a long time and the membrane is then inflated so as to separate the wafer from the membrane, a local stress may be applied to the wafer. As a result, fine interconnects formed on the wafer may be fractured or the wafer itself may be damaged. Accordingly, improving the wafer release process leads to an improvement of productivity.

SUMMARY OF THE INVENTION

A first object of the present invention is to provide a polishing apparatus and a polishing method capable of quickly and securely releasing a substrate, such as a wafer, from a substrate holder, such as a top ring, after the substrate is polished.

A second object of the present invention is to provide a polishing apparatus and a polishing method capable of reliably detecting release of a substrate from a substrate holding surface.

A polishing apparatus includes: a polishing table for supporting a polishing pad; a substrate holder having a substrate holding surface and a pressure chamber formed by a flexible membrane, the substrate holder being configured to hold a substrate on the substrate holding surface and press the substrate against the polishing pad via pressure in the pressure chamber; a substrate separation assisting device configured to eject a fluid to a contact portion between the substrate and the flexible membrane so as to release the substrate from the substrate holding surface; a vertically-moving mechanism configured to vertically move one of the substrate holder and the substrate separation assisting device; and a controller configured to control operations of the vertically-moving mechanism and the substrate separation assisting device, the controller being configured to cause the vertically-moving mechanism to move one of the substrate holder and the substrate separation assisting device vertically in accordance with an amount of descent of the contact portion and then cause the substrate separation assisting device to eject the fluid to the contact portion.

A polishing apparatus includes: a polishing table for supporting a polishing pad; a substrate holder having a substrate holding surface and a pressure chamber formed by a flexible membrane, the substrate holder being configured to hold a substrate on the substrate holding surface and press the substrate against the polishing pad via pressure in the pressure chamber; a substrate separation assisting device configured to eject a fluid to a contact portion between the substrate and the flexible membrane so as to release the substrate from the substrate holding surface; a tilting device configured to tilt the substrate separation assisting device; and a controller configured to control operations of the tilting device and the substrate separation assisting device, the controller being configured to tilt the substrate separation assisting device in accordance with an amount of descent of the contact portion and then cause the substrate separation assisting device to eject the fluid to the contact portion.

A method of polishing a substrate using a substrate holder having a substrate holding surface and a pressure chamber formed by a flexible membrane, includes: pressing the substrate against a polishing pad via pressure in the pressure chamber; providing a relative movement between the substrate and the polishing pad to polish the substrate; after polishing of the substrate, holding the substrate on the substrate holding surface; transporting the substrate to a substrate transfer position; vertically moving one of the substrate holder and a substrate separation assisting device in accordance with an amount of descent of a contact portion between the substrate and the flexible membrane; and ejecting a fluid from the substrate separation assisting device to the contact portion to release the substrate from the substrate holding surface.

A method of polishing a substrate using a substrate holder having a substrate holding surface and a pressure chamber formed by a flexible membrane, includes: pressing the substrate against a polishing pad via pressure in the pressure chamber; providing a relative movement between the substrate and the polishing pad to polish the substrate; after polishing of the substrate, holding the substrate on the substrate holding surface; transporting the substrate to a substrate transfer position; tilting a substrate separation assisting device in accordance with an amount of descent of a contact portion between the substrate and the flexible membrane; and ejecting a fluid from the substrate separation assisting device to the contact portion to release the substrate from the substrate holding surface.

A polishing apparatus includes: a polishing table for supporting a polishing pad; a substrate holder having a substrate holding surface and a pressure chamber formed by a flexible membrane, the substrate holder being configured to hold a substrate on the substrate holding surface and press the substrate against the polishing pad via pressure in the pressure chamber; and a substrate release detector configured to detect release of the substrate from the substrate holding surface based on a change in the pressure.

A method of polishing a substrate using a substrate holder having a substrate holding surface and a pressure chamber formed by a flexible membrane, includes: pressing the substrate against a polishing pad via pressure in the pressure chamber; providing a relative movement between the substrate and the polishing pad to polish the substrate; after polishing of the substrate, holding the substrate on the substrate holding surface; transporting the substrate to a substrate transfer position; monitoring a change in the pressure; and detecting release of the substrate from the substrate holding surface based on the change in the pressure.

The substrate holder is elevated or lowered in accordance with the amount of descent of the contact portion between the substrate and the flexible membrane. Therefore, the substrate separation assisting unit can eject the fluid to the contact portion between the substrate and the flexible membrane.

The substrate separation assisting unit is elevated or lowered, or inclined in accordance with the amount of descent of the contact portion between the substrate and the flexible membrane. Therefore, the substrate separation assisting unit can eject the fluid to the contact portion between the substrate and the flexible membrane.

Whether the substrate has been released from the substrate holding surface can be reliably detected by monitoring the change in the pressure in the pressure chamber.

DETAILED DESCRIPTION

Embodiments will be described below with reference to FIGS. 1 through 10. Like or corresponding structural elements are denoted by the same reference numerals in FIGS. 1 through 10 and will not be described repetitively.

Figure 1:
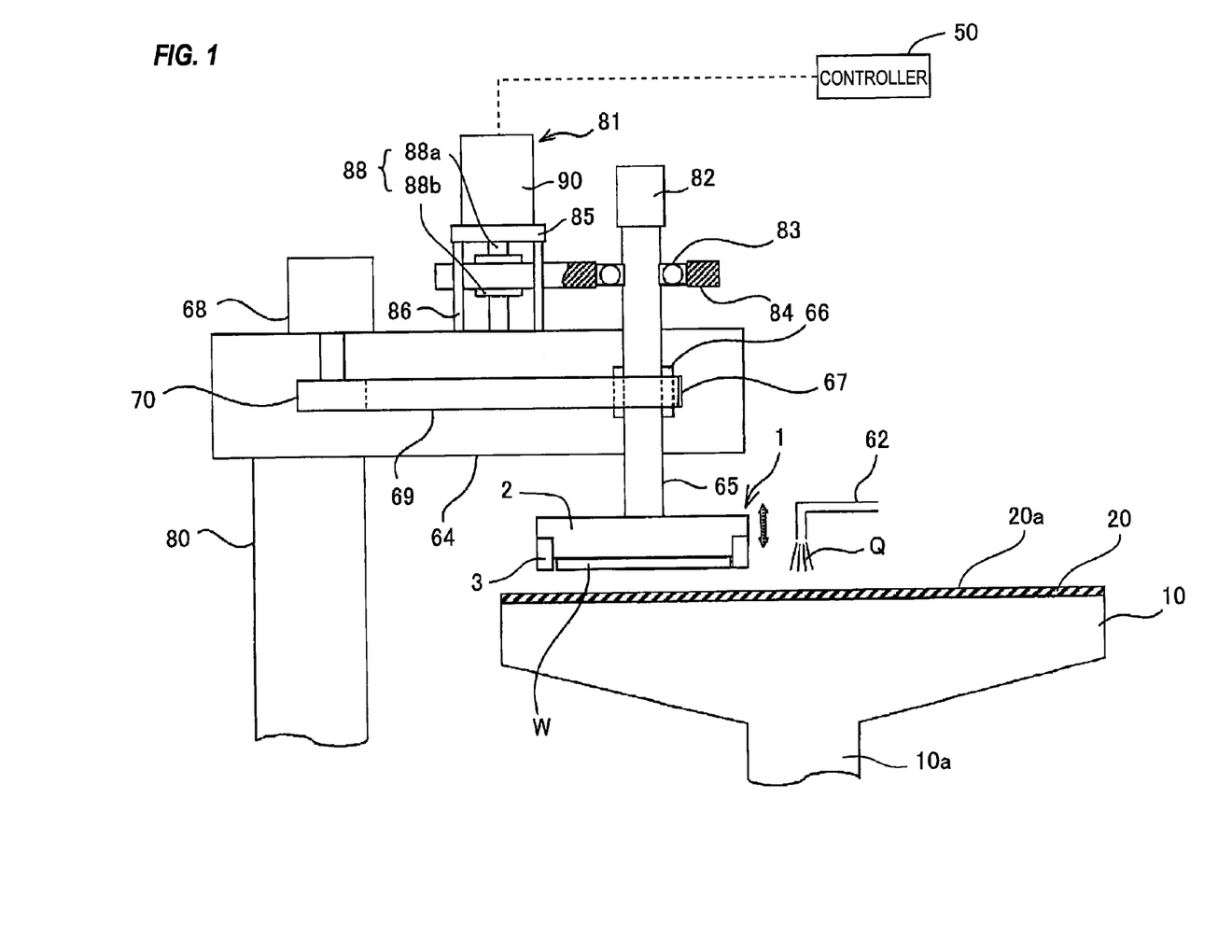
FIG. 1 is a schematic view showing a first embodiment of an entire polishing apparatus.

FIG. 1 is a schematic view showing an entire structure of a polishing apparatus according to the first embodiment. As shown in FIG. 1, the polishing apparatus includes a polishing table 10, and a top ring (a substrate holder) 1 for holding a substrate, such as a wafer, as an object to be polished and pressing the substrate against a polishing pad 20 on the polishing table 10.

The polishing table 10 is coupled via a table shaft 10a to a motor (not shown) disposed below the polishing table 10. Thus, the polishing table 10 is rotatable about the table shaft 10a. The polishing pad 20 is attached to an upper surface of the polishing table 10. An upper surface of the polishing pad 20 serves as a polishing surface 20a for polishing a wafer W. A polishing liquid supply nozzle 62 is provided above the polishing table 10 to supply a polishing liquid Q onto the polishing pad 20 on the polishing table 10.

The top ring 1 includes a top ring body 2 for pressing the wafer W against the polishing surface 20a, and a retaining ring 3 for retaining the wafer W so as to prevent the wafer W from being spun off from the top ring 1.

The top ring 1 is connected to a top ring shaft 65, which is vertically movable relative to a polishing head 64 by a vertically moving mechanism 81. The vertical movement of the top ring shaft 65 enables the top ring 1 in its entirety to move upward and downward and enables positioning of the top ring 1 with respect to the top ring head 64. A rotary joint 82 is mounted to the upper end of the top ring shaft 65.

The vertically moving mechanism 81 for vertically moving the top ring shaft 65 and the top ring 1 includes a bridge 84 for rotatably supporting the top ring shaft 65 through a bearing 83, a ball screw 88 mounted to the bridge 84, a support pedestal 85 supported by support posts 86, and a servomotor 90 mounted to the support pedestal 85. The support pedestal 85, which supports the servomotor 90, is fixedly mounted to the top ring head 64 through the support posts 86.

The ball screw 88 includes a screw shaft 88a coupled to the servomotor 90 and a nut 88b that engages with the screw shaft 88a. The top ring shaft 65 is vertically movable in unison with the bridge 84. When the servomotor 90 is set in motion, the bridge 84 moves vertically through the ball screw 88, so that the top ring shaft 65 and the top ring 1 move vertically.

The top ring shaft 65 is connected to a rotary sleeve 66 by a key (not shown). A timing pulley 67 is secured to a circumferential surface of the rotary sleeve 66. A top ring motor 68 is fixed to the top ring head 64. The timing pulley 67 is operatively coupled to a timing pulley 70, mounted to the top ring motor 68, through a timing belt 69. When the top ring motor 68 is set in motion, the rotary sleeve 66 and the top ring shaft 65 are rotated in unison with each other through the timing pulley 70, the timing belt 69, and the timing pulley 67, thus rotating the top ring 1. The top ring head 64 is supported by a top ring head shaft 80, which is rotatably supported by a frame (not shown). The polishing apparatus further includes a controller 50 for controlling devices including the top ring motor 68 and the servomotor 90.

The top ring 1 is configured to hold the wafer W on its lower surface. The top ring head 64 is configured to be able to pivot on the top ring head shaft 80. Thus, the top ring 1, which holds the wafer W on its lower surface, is moved between a position at which the top ring 1 receives the wafer W and a position above the polishing table 10 by a pivotal movement of the top ring head 64. Polishing of the wafer W is performed as follows. While the top ring 1 and the polishing table 10 are rotated individually, the polishing liquid Q is supplied onto the polishing pad 20 from the polishing liquid supply nozzle 62 provided above the polishing table 10. In this state, the top ring 1 is lowered and then presses the wafer W against the polishing surface 20a of the polishing pad 20. The wafer W is placed in sliding contact with the polishing surface 20a of the polishing pad 20, so that a surface of the wafer W is polished.

Figure 2:
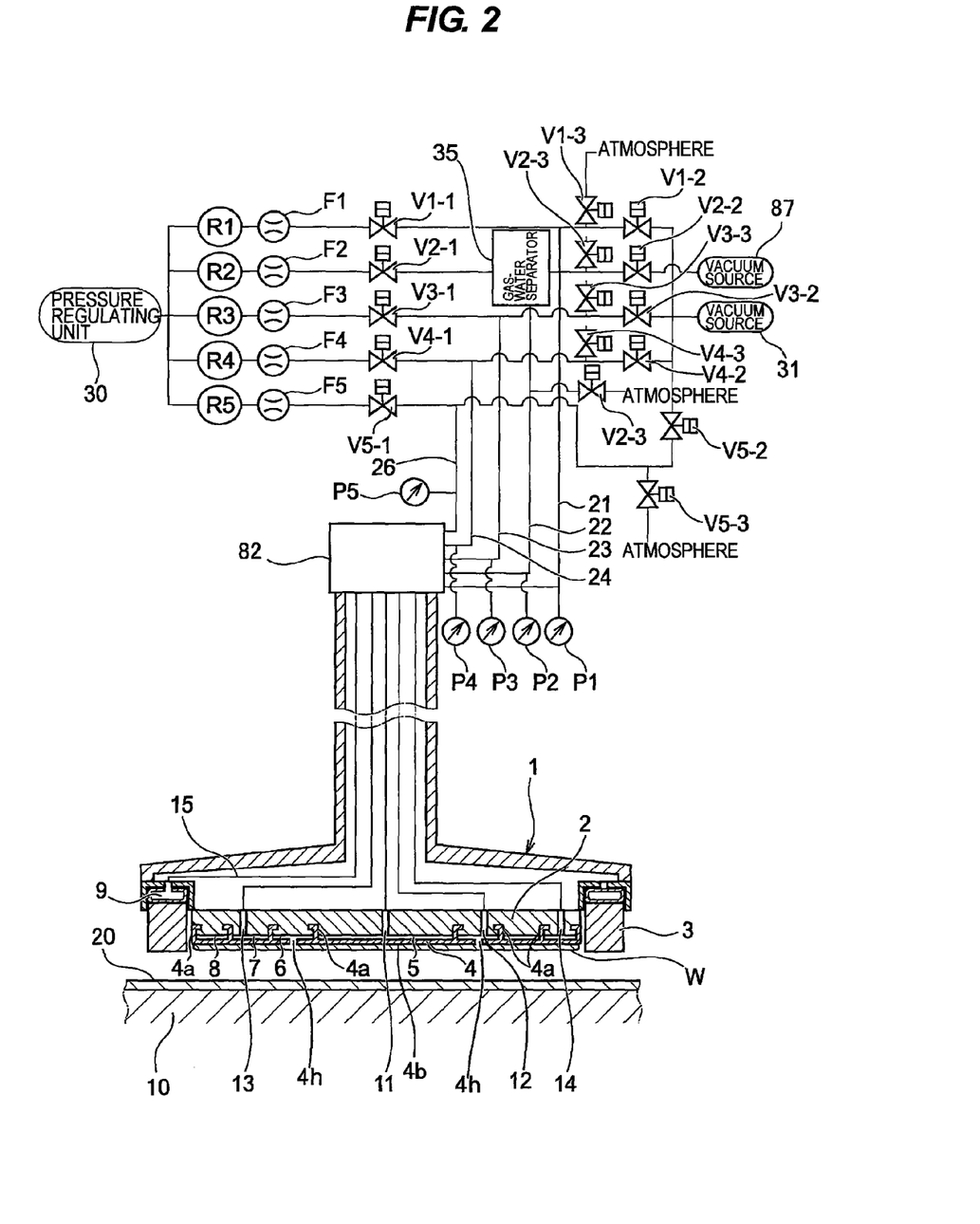
FIG. 2 is a schematic cross-sectional view of a top ring for holding a wafer and pressing the wafer against a polishing pad on a polishing table.

Next, the top ring of the polishing apparatus will be described. FIG. 2 is a schematic cross-sectional view showing the top ring 1 for holding the wafer W as an object to be polished and pressing the wafer W against the polishing pad 20 on the polishing table 10. FIG. 2 shows only main structural elements constituting the top ring 1.

As shown in FIG. 2, the top ring 1 includes a membrane (flexible membrane) 4 for pressing the wafer W against the polishing pad 20, the top ring body 2 (which is also referred to as a carrier) holding the membrane 4, and the retaining ring 3 for directly pressing the polishing pad 20. The top ring body 2 is in the form of a circular plate, and the retaining ring 3 is attached to a peripheral portion of the top ring body 2. The top ring body 2 is made of resin, such as engineering plastic (e.g., PEEK). The membrane 4, which is brought into contact with a rear face of the wafer W, is attached to a lower surface of the top ring body 2. The membrane 4 is made of a highly strong and durable rubber material, such as ethylene propylene rubber (EPDM), polyurethane rubber, silicone rubber, or the like.

The membrane 4 has a plurality of concentric partition walls 4a, which form multiple pressure chambers: a circular central chamber 5; an annular ripple chamber 6; an annular outer chamber 7; and an annular edge chamber 8. These pressure chambers are located between the upper surface of the membrane 4 and the lower surface of the top ring body 2. The central chamber 5 is defined at the central portion of the top ring body 2, and the ripple chamber 6, the outer chamber 7, and the edge chamber 8 are concentrically defined in the order from the central portion to the peripheral portion of the top ring body 2.

The wafer W is held on a substrate holding surface 4b which is constituted by the membrane 4. The membrane 4 has holes 4h for wafer suction located in positions corresponding to the position of the ripple chamber 6. While the holes 4h are located in the corresponding position of the ripple chamber 6 in this embodiment, the holes 4h may be located in positions of other pressure chamber. A passage 11 communicating with the central chamber 5, a passage 12 communicating with the ripple chamber 6, a passage 13 communicating with the outer chamber 7, and a passage 14 communicating with the edge chamber 8 are formed in the top ring body 2. The passage 11, the passage 13, and the passage 14 are connected via the rotary joint 82 to passages 21, 23, and 24, respectively. These passages 21, 23, and 24 are coupled to a pressure regulating unit 30 via respective valves V1-1, V3-1, and V4-1 and respective pressure regulators R1, R3, and R4. The passages 21, 23, and 24 are coupled to a vacuum source 31 through valves V1-2, V3-2, and V4-2 respectively, and further communicate with the atmosphere through valves V1-3, V3-3, and V4-3 respectively.

The passage 12 communicating with the ripple chamber 6 is coupled to the passage 22 via the rotary joint 82. The passage 22 is coupled to the pressure regulating unit 30 via a gas-water separation tank 35, a valve V2-1, and a pressure regulator R2. Further, the passage 22 is coupled to a vacuum source 87 via the gas-water separation tank 35 and a valve V2-2, and further communicates with the atmosphere via a valve V2-3.

A retaining ring pressure chamber 9, which is formed by a flexible membrane, is provided right above the retaining ring 3. This retaining ring pressure chamber 9 is coupled to a passage 26 via a passage 15 formed in the top ring body 2 and the rotary joint 82. The passage 26 is coupled to the pressure regulating unit 30 via a valve V5-1 and a pressure regulator R5. Further, the passage 26 is coupled to the vacuum source 31 via a valve V5-2, and communicates with the atmosphere through a valve V5-3. The pressure regulators R1, R2, R3, R4, and R5 have a pressure regulating function to regulate pressures of the fluid (e.g., a gas, such as air or nitrogen) supplied from the pressure regulating unit 30 to the central chamber 5, the ripple chamber 6, the outer chamber 7, the edge chamber 8, and the retaining ring pressure chamber 9, respectively. The pressure regulators R1, R2, R3, R4, and R5 and the valves V1-1 to V1-3, V2-1 to V2-3, V3-1 to V3-3, V4-1 to V4-3, and V5-1 to V5-3 are coupled to the controller 50 (see FIG. 1), so that operations of these pressure regulators and these valves are controlled by the controller 50. Further, pressure sensors P1, P2, P3, P4, and P5 and flow rate sensors F1, F2, F3, F4, and F5 are provided in the passages 21, 22, 23, 24, and 26, respectively.

The pressures in the central chamber 5, the ripple chamber 6, the outer chamber 7, the edge chamber 8, and the retaining ring pressure chamber 9 are measured by the presser sensors P1, P2, P3, P4, and P5, respectively. Flow rates of the pressurized fluid supplied to the central chamber 5, the ripple chamber 6, the outer chamber 7, the edge chamber 8, and the retaining ring pressure chamber 9 are measured by the flow rate sensors F1, F2, F3, F4, and F5, respectively.

In the top ring 1 shown in FIG. 2, as described above, the central chamber 5 is defined at the central portion of the top ring body 2, and the ripple chamber 6, the outer chamber 7, and the edge chamber 8 are concentrically defined in the order from the central portion to the peripheral portion of the top ring body 2. The pressures of the fluid supplied to the central chamber 5, the ripple chamber 6, the outer chamber 7, the edge chamber 8, and the retaining ring pressure chamber 9 can be independently controlled by the pressure regulating unit 30 and the pressure regulators R1, R2, R3, R4, and R5. With this structure, forces of pressing the wafer W against the polishing pad 20 can be adjusted at respective local areas of the wafer, and a force of pressing the polishing pad 20 by the retaining ring 3 can be adjusted.

Next, a sequence of polishing processes of the polishing apparatus shown in FIGS. 1 and 2 will be described.

The top ring 1 receives the wafer W in a substrate transfer position and holds the wafer W thereon via the vacuum suction. Holding of the wafer W under the vacuum suction is achieved by producing a vacuum in the holes 4h that are in fluid communication with the vacuum source 87. The top ring 1 which holds the wafer W is lowered to a preset polishing position. At this preset polishing position, the retaining ring 3 is brought into contact with the polishing surface 20a of the polishing pad 20, while a small gap (e.g., about 1 mm) is formed between the lower surface (a surface to be polished) of the wafer W and the polishing surface 20a of the polishing pad 20, because the wafer W is held by the top ring 1 before the wafer W is polished. At this time, the polishing table 10 and the top ring 1 are being rotated about their own axes. In this state, the membrane 4, which is provided behind the wafer W, is inflated to bring the lower surface of the wafer W into contact with the polishing surface 20a of the polishing pad 20, so that the polishing pad 20 is in sliding contact with the wafer W to thereby polish the surface of the wafer W.

After the wafer polishing process on the polishing pad 20 is terminated, the wafer W is attracted to the top ring 1, which is then elevated. The top ring 1 is moved to the substrate transfer position above a pusher (which will be described later), and then the fluid is injected into the ripple chamber 6 to release the wafer W.

Figure 3A:
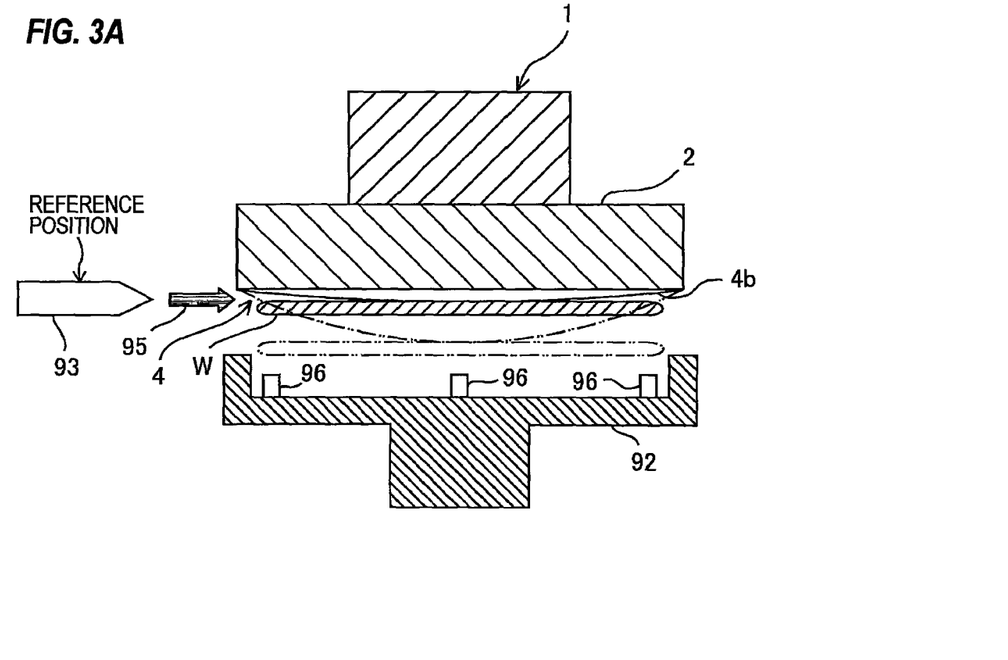
FIG. 3A is a view showing a reference position of a release nozzle.
Figure 3B:
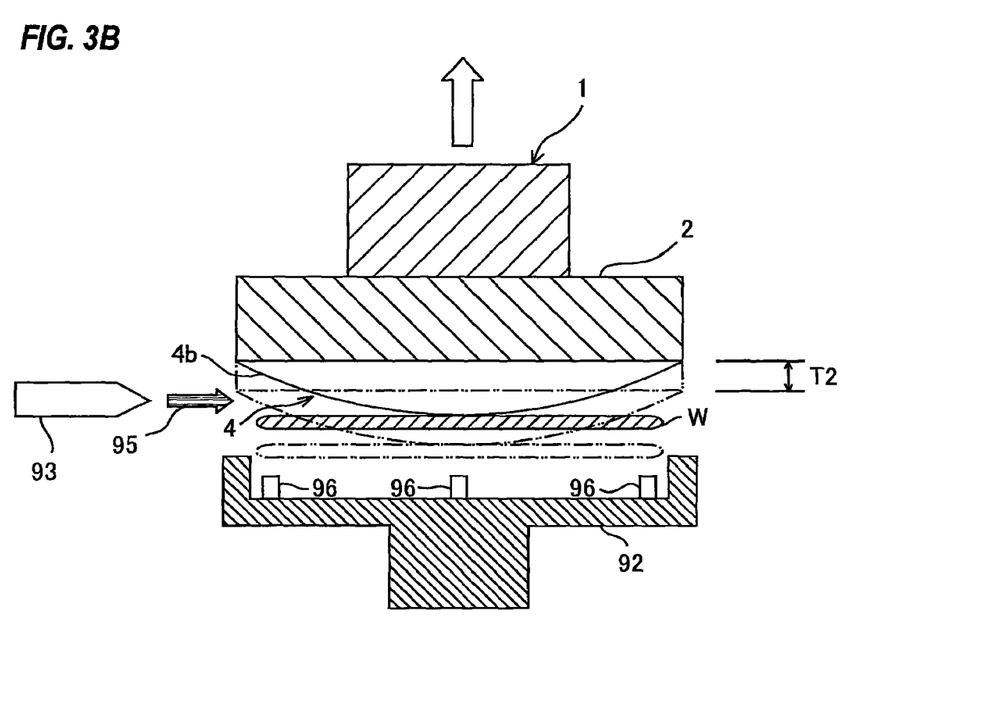
FIG. 3B is a view showing a manner of elevating the top ring.

FIG. 3A is a view showing a reference position of a release nozzle 93, and FIG. 3B is a view showing a manner of elevating the top ring 1. A pusher 92 is disposed near the polishing table 10. When the wafer W is transported to the pusher 92, the wafer W is held via the vacuum suction on the substrate holding surface 4b constituted by the membrane 4 and the top ring 1 is moved to the substrate transfer position above the pusher 92 while the wafer W is attracted to the top ring 1. The fluid is then supplied from the pressure regulating unit 30 to the ripple chamber 6.

The release nozzle (i.e., a substrate separation assisting device) 93 for ejecting a fluid 95 is provided near the top ring 1. Operations of the release nozzle 93 are controlled by the controller 50. As shown in FIG. 3A, the reference position of the release nozzle 93 is set to a vertical position of the contact portion between the wafer W and the membrane 4 before the membrane 4 is stretched greatly. The release nozzle 93 is located at this reference position. The release nozzle 93 ejects the fluid 95 to the contact portion between the wafer W and the membrane 4. The fluid 95 may be a fluid mixture of pure water and $N_2$ (nitrogen). By ejecting the jet of the fluid 95 to the contact portion between the wafer W and the membrane 4, the wafer W is released easily from the top ring 1. A substrate detection sensor 96 for detecting the presence of the wafer W is mounted to an upper surface of the pusher 92. When the wafer W is released from the top ring 1 and the substrate detection sensor 96 detects the wafer W, the pusher 92 is lowered for transporting the wafer W to a transporter, such as a transfer robot.

Figure 4:
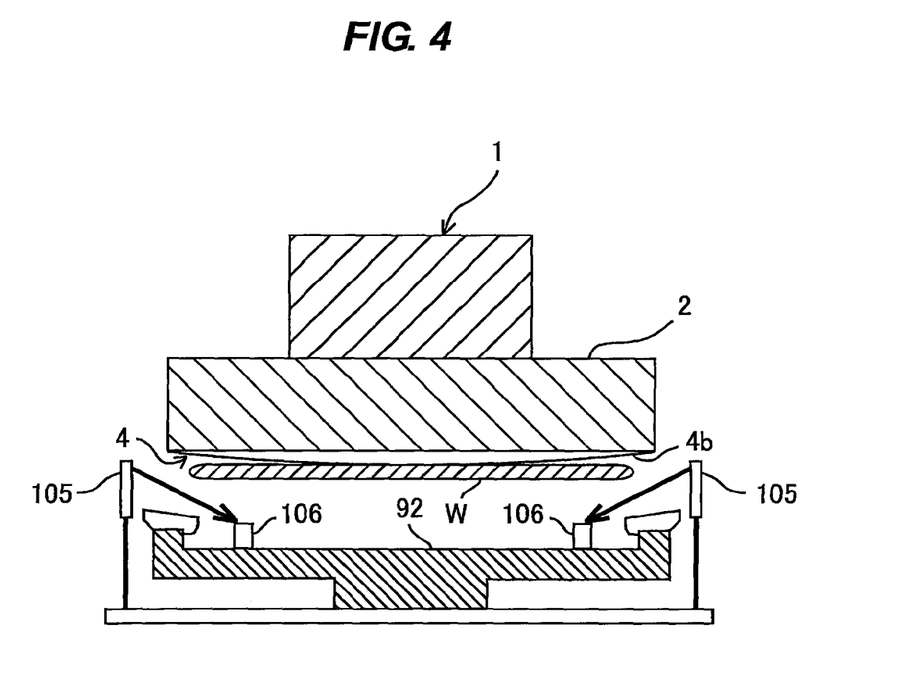
FIG. 4 is a view showing another structure of a substrate detection sensor.

Various types of sensors can be used as the substrate detection sensor. For example, the substrate detection sensor 96 shown in FIG. 3A and FIG. 3B is a contact-type substrate detection sensor configured to detect the release of the wafer W through the contact with the wafer W. As shown in FIG. 4, instead of the substrate detection sensor 96, a non-contact-type substrate detection sensor having a light emitter 105 and a light receiver 106 may be used. This type of substrate detection sensor detects the release of the wafer W when the wafer W interrupts a light emitted by the light emitter 105 toward the light receiver 106.

As discussed with reference to FIG. 12, when the wafer W is released, the membrane 4 is stretched greatly due to the self-weight of the wafer W and the inflated membrane 104. As a result, the contact portion between the wafer W and the membrane 4 is lowered. A two-dot chain line in FIG. 3A indicates the lowered contact portion between the wafer W and the membrane 4. If the fluid 95 is ejected toward the position that is set before the membrane 4 is stretched, the fluid does not impinge on the contact portion between the wafer W and the membrane 4. To solve this problem, as shown in FIG. 3B, the top ring 1 is elevated by a distance T2 from the reference position of the release nozzle 93 in accordance with an amount of descent of the wafer W. This operation can enable the fluid 95 to impinge on the contact portion between the wafer W and the membrane 4 accurately. The release nozzle 93 may be installed below the reference position. In this case, the top ring 1 is lowered by the distance T2. The top ring 1 is elevated and lowered by the vertically moving mechanism 81. Calculation of the distance T2 will be described below.

Figure 5:
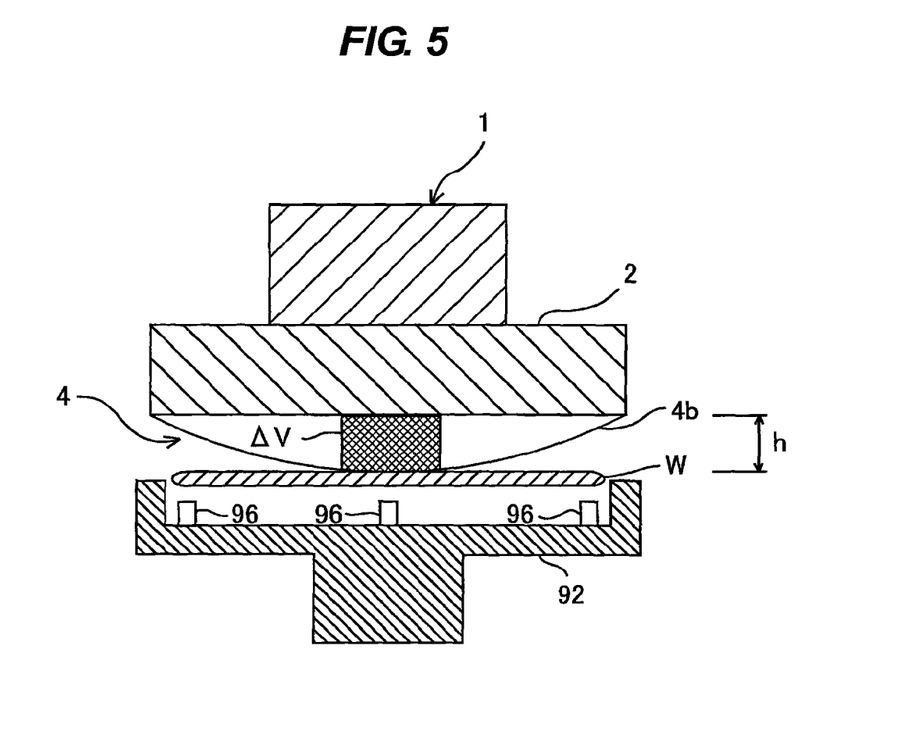
FIG. 5 is a schematic view showing a state in which a membrane is stretched.

FIG. 5 is a schematic view showing a state in which the membrane 4 is stretched. Assuming that an increased volume of the central chamber 5 from its initial volume when the membrane 4 is stretched is represented by a column space indicated by ΔV shown in FIG. 5, the following relational expression holds under a constant-temperature condition according to Boyle's law.

$$P_0 \times V_0 = (P_0 - P) \times (V_0 + S \times h)$$

This expression is transformed into $$h = P \times V_0 / S(P_0 - P)$$

where $P_0$ is an atmospheric pressure [Pa], $V_0$ is the initial volume of the central chamber [m³], S is a horizontal cross-sectional area of the central chamber [m²], h is an amount of stretch of the membrane [m], and P is an amount of decrease in the pressure in the central chamber (positive value) [Pa]. The initial volume $V_0$ of the central chamber 5 is determined in advance by measurements or calculations.

In the above relational expression, the product of the horizontal cross-sectional area S of the central chamber 5 and the amount of stretch h of the membrane 4 (which is the amount of descent of the contact portion between the wafer W and the membrane 4) corresponds to the increased volume ΔV. The controller 50 calculates the amount of stretch h with use of the above-described relational expression and determines the distance T2 from the amount of stretch h. The distance T2 may be equal to the amount of stretch h, or may be smaller than the amount of stretch h. The controller 50 serves as an arithmetic device for calculating the amount of stretch h. This amount of stretch h is calculated from the value of the decrease in the pressure in the central chamber 5. The pressure in the central chamber 5 is measured by the pressure sensor P1. By elevating the top ring 1 by the distance T2, the fluid 95 from the release nozzle 93 can impinge on the contact portion between the wafer W and the membrane 4 accurately. Therefore, it is possible to release the wafer W from the top ring 1 quickly and reliably.

Figure 6:
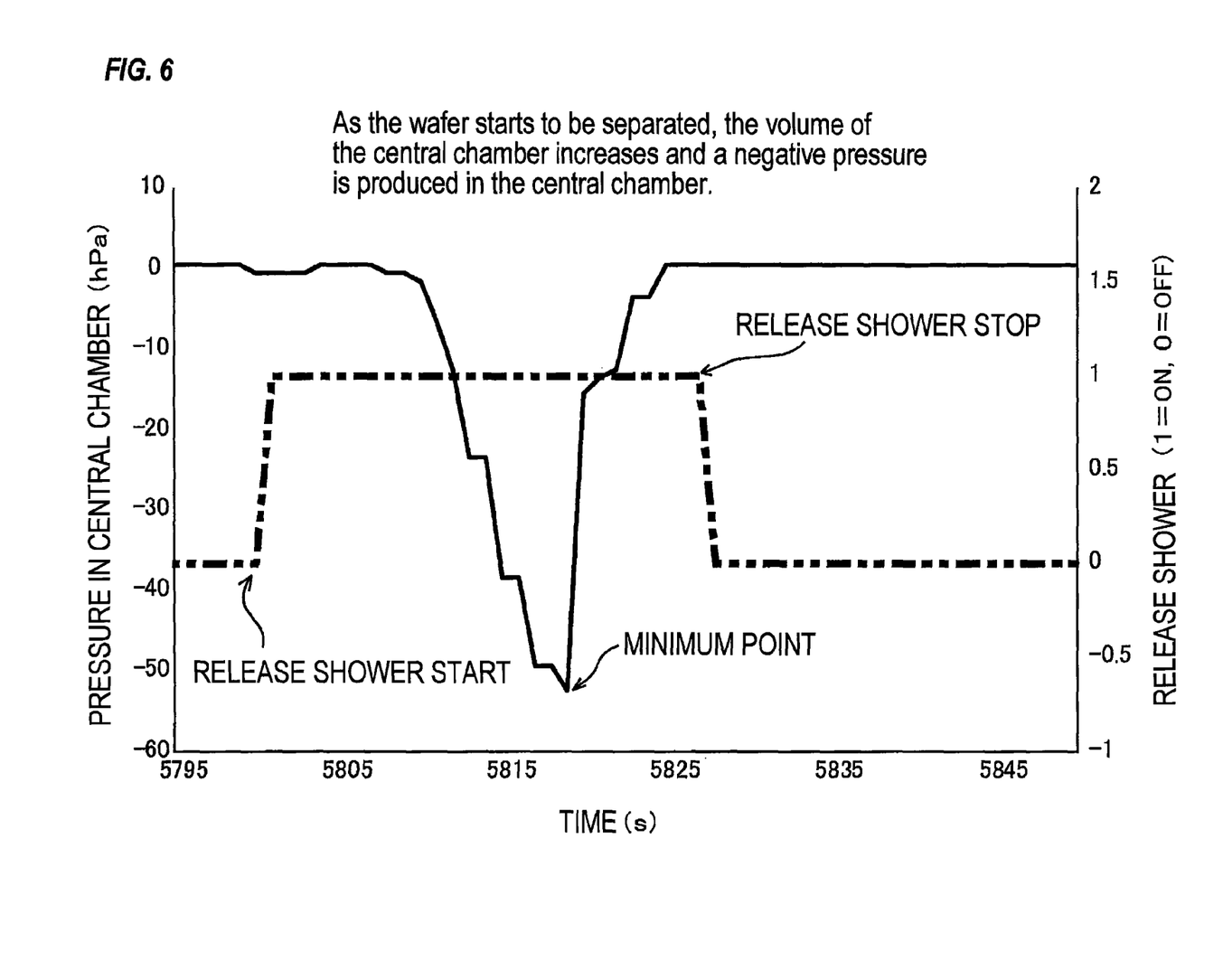
FIG. 6 is a graph showing pressure in a central chamber that changes with time.

FIG. 6 is a graph showing the pressure in the central chamber 5 that changes with time. Vertical axis represents the pressure in the central chamber 5, and horizontal axis represents time. As shown in this graph, when the separation of the wafer W from the membrane 4 starts (i.e., the membrane 4 starts to be stretched), the volume of the central chamber 5 increases and the pressure in the central chamber 5 decreases. When the wafer W is released from the membrane 4, the pressure in the central chamber 5 is returned to the previous value at which the membrane 4 is not stretched. This minimum point of the pressure in the central chamber 5 is a release point of the wafer W.

The ejection of the fluid 95 is started before the membrane 4 starts to be stretched and is terminated after the wafer W is released. The controller 50 monitors the change in the pressure in the central chamber 5, and detects the release of the wafer W from the substrate holding surface 4b based on the change in the pressure. Specifically, the controller 50 detects the minimum point of the pressure so as to correctly determine whether or not the wafer W is released from the membrane 4. If the minimum point is not detected within a predetermined time, the controller 50 judges that the wafer W is not released from the membrane 4. After the controller 50 detects the minimum point of the pressure in the central chamber 5, the pusher 92, on which the wafer is place, is lowered. This operation can ensure the prevention of the damage to the wafer W. The controller 50 serves as a substrate release detector for detecting the release of the wafer W from the substrate holding surface 4b based on the change in the pressure in the central chamber 5.

In a second embodiment, the controller 50 may use a cumulative value of the flow rate of the fluid flowing into the central chamber 5 for determining whether or not the wafer W is released from the membrane 4 and/or the amount of stretch h of the membrane 4. The cumulative value of the flow rate from when the releasing operation of the wafer W is started corresponds to the increased volume ΔV of the central chamber 5. Therefore, the amount of stretch h can be calculated by dividing the increased volume ΔV by the horizontal cross-sectional area S of the central chamber 5. The controller 50 calculates the amount of stretch h from the values of ΔV and S and determines the distance T2 from the amount of stretch h. The distance T2 may be equal to or smaller than the amount of stretch h.

The amount of stretch h can be calculated as follows. First, the valve V1-3 is closed so as to shut off the communication between the passage 21 and the atmosphere. Next, the pressure regulator R1 is adjusted such that the fluid with the atmospheric pressure is supplied into the central chamber 5. The pressure regulator R1 at this time serves as a relief valve that is opened when the pressure is higher than the atmospheric pressure. Since the fluid flows into the central chamber 5 through the flow rate sensor F1, the controller 50 can calculate the increased volume ΔV of the central chamber 5 from the cumulative value of the flow rate of the fluid flowing through the flow rate sensor F1 and can further calculate the amount of stretch h by dividing ΔV by S. Since the top ring 1 is elevated by the distance T2 as shown in FIG. 3B, the fluid 95 from the release nozzle 93 can impinge on the contact portion between the wafer W and the membrane 4 accurately. Therefore, it is possible to release the wafer W from the top ring 1 quickly and reliably.

Figure 7:
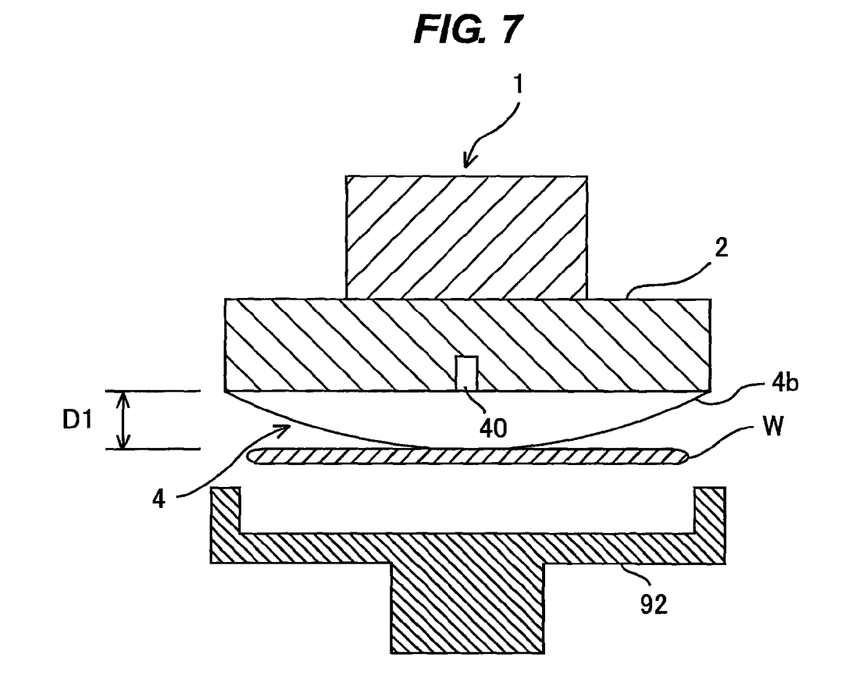
FIG. 7 shows a third embodiment of the polishing apparatus.

FIG. 7 shows a third embodiment of the polishing apparatus. Structures, which will not be described particularly, are identical to those of the first embodiment, and their repetitive explanations are omitted.

As shown in FIG. 7, a distance measuring sensor 40 is embedded in a lower surface of the top ring body 2. This distance measuring sensor 40 is configured to measure a distance D1 between the distance measuring sensor 40 and the rear surface of the membrane 4. This distance D1 is the amount of stretch h of the membrane 4. The controller 50 determines the distance T2 (see FIG. 3B) from the value of the amount of stretch h. The distance T2 may be equal to or smaller than the amount of stretch h. Since the top ring 1 is elevated by the distance T2, the fluid 95 from the release nozzle 93 can impinge on the contact portion between the wafer W and the membrane 4 accurately. Therefore, it is possible to release the wafer W from the top ring 1 quickly and reliably.

Figure 8:
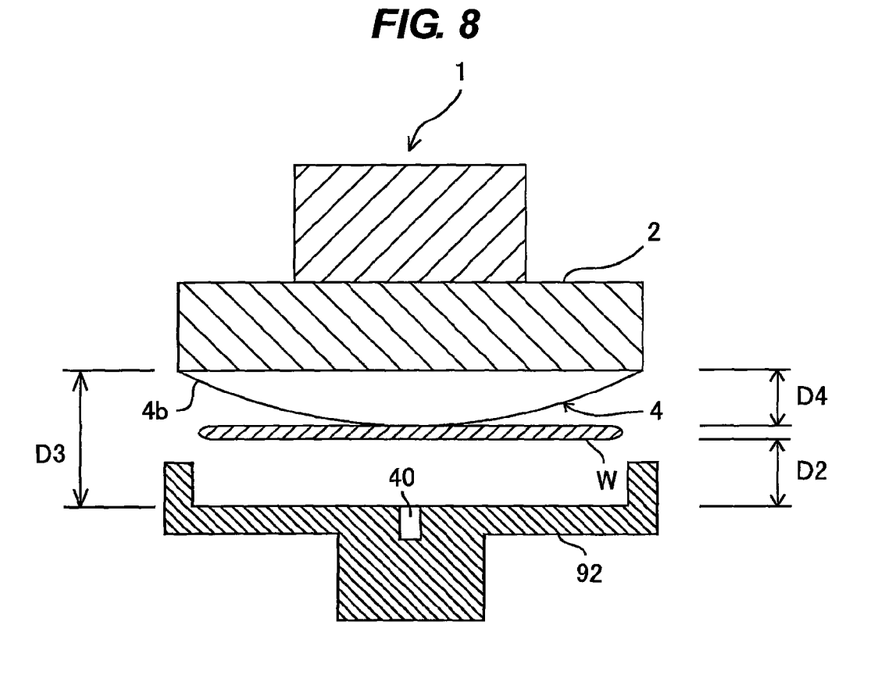
FIG. 8 is a view showing another structure of the polishing apparatus shown in FIG. 7.

FIG. 8 is a view showing another structure of the polishing apparatus shown in FIG. 7. In FIG. 8, the distance measuring sensor 40 is embedded in an upper surface of the pusher 92. This distance measuring sensor 40 is configured to measure a distance D2 between the distance measuring sensor 40 and the surface of the wafer W. A distance D3 between the distance measuring sensor 40 and the top ring body 2 is measured in advance. The distance D2 between the distance measuring sensor 40 and the surface of the wafer W is measured by the distance measuring sensor 40, and the controller 50 determines a distance D4 by subtracting the distance D2 and a thickness of the wafer W from the distance D3. This distance D4 is the amount of stretch h of the membrane 4. The controller 50 determines the distance T2 from the value of the amount of stretch h. The distance T2 may be equal to or smaller than the amount of stretch h. Since the top ring 1 is elevated by the distance T2, the fluid 95 from the release nozzle 93 can impinge on the contact portion between the wafer W and the membrane 4 accurately. Therefore, it is possible to release the wafer W from the top ring 1 quickly and reliably.

Figure 9:
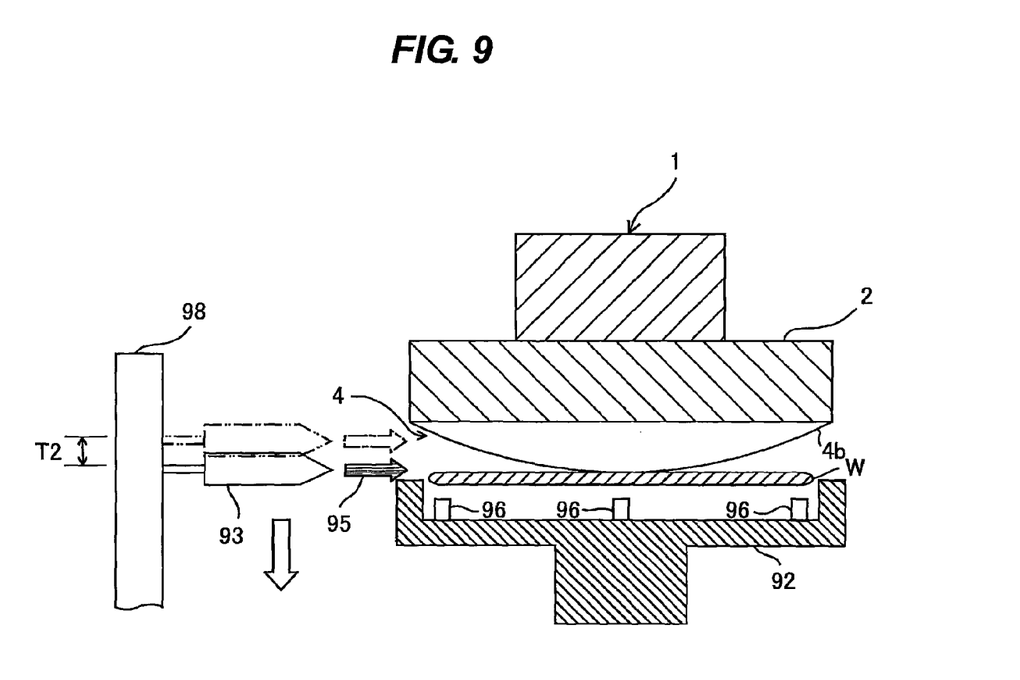
FIG. 9 shows a fourth embodiment of the polishing apparatus.

FIG. 9 shows a fourth embodiment of the polishing apparatus. Structures, which will not be described particularly, are identical to those of the first embodiment, and their repetitive explanations are omitted.

As shown in FIG. 9, the release nozzle 93 is mounted to an elevating device (a vertically moving device) 98, which is configured to elevate and lower the release nozzle 93. Operations of the elevating device 98 are controlled by the controller 50. In the fourth embodiment, instead of elevating the top ring 1, the release nozzle 93 is lowered to a position of the contact portion between the wafer W and the membrane 4. Since the release nozzle 93 is lowered by the distance T2 from the predetermined reference position (see FIG. 3A) while the top ring 1 is not elevated, the fluid 95 from the release nozzle 93 can impinge on the contact portion between the wafer W and the membrane 4 accurately. Therefore, it is possible to release the wafer W from the top ring 1 quickly and reliably.

The release nozzle 93 may be disposed below the reference position. In this case, the release nozzle 93 is elevated by the distance T2.

Figure 10:
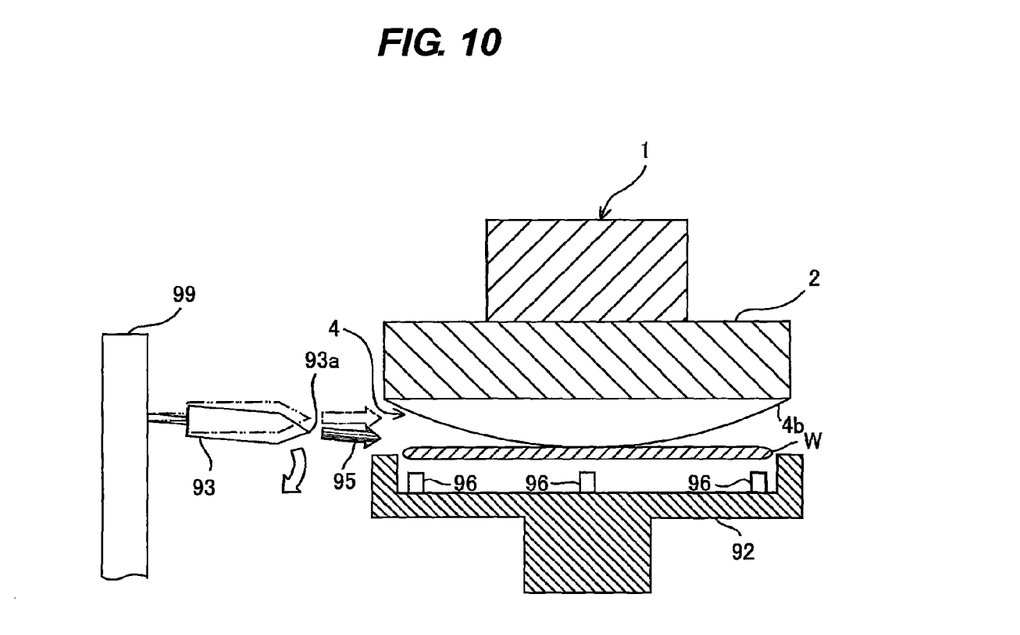
FIG. 10 shows a fifth embodiment of the polishing apparatus.

FIG. 10 shows a fifth embodiment of the polishing apparatus. Structures, which will not be described particularly, are identical to those of the first embodiment, and their repetitive explanations are omitted.

As shown in FIG. 10, the release nozzle 93 is mounted to a tilting device 99, which is configured to tilt the release nozzle 93 with respect to a horizontal direction. In this fifth embodiment, the tilting device 99 tilts the release nozzle 93 such that an ejection mouth 93a of the release nozzle 93 is pointed at the contact portion between the wafer W and the membrane 4. An angle of the release nozzle 93 to be tilted is determined based on the amount of stretch h of the membrane 4. Since the release nozzle 93 is tilted by the angle that is determined based on the amount of stretch h, the fluid 95 from the release nozzle 93 can impinge on the contact portion between the wafer W and the membrane 4 accurately. Therefore, it is possible to release the wafer W from the top ring 1 quickly and reliably.

The above-discussed first to fifth embodiments may be combined appropriately. For example, the vertically-movable top ring 1, the vertically-movable release nozzle 93, and the tiltable release nozzle 93 may be combined.

The present invention is not limited to the above-discussed embodiments and can be applied to other embodiments within a technical concept of the present invention.

What is claimed is:

1. A polishing apparatus, comprising:
 a polishing table for supporting a polishing pad;
 a substrate holder having a substrate holding surface and a pressure chamber formed by a flexible membrane, the substrate holder being configured to hold a substrate on the substrate holding surface and press the substrate against the polishing pad via pressure in the pressure chamber;
 a substrate separation assisting device configured to eject a fluid to a contact portion between the substrate and the flexible membrane so as to release the substrate from the substrate holding surface;
 a vertically-moving mechanism configured to vertically move the substrate holder; and
 a controller configured to control operations of the vertically-moving mechanism and the substrate separation assisting device,
 the controller being configured to cause the vertically-moving mechanism to move the substrate holder vertically in accordance with an amount of descent of the contact portion and then cause the substrate separation assisting device to eject the fluid to the contact portion.

2. The polishing apparatus according to claim 1, wherein the controller is configured to detect a minimum point of the pressure in the pressure chamber to thereby detect release of the substrate from the substrate holding surface.

3. The polishing apparatus according to claim 1, wherein the controller is configured to calculate the amount of descent of the contact portion from an amount of decrease in the pressure in the pressure chamber.

4. A polishing apparatus, comprising:
 a polishing table for supporting a polishing pad;
 a substrate holder having a substrate holding surface and a pressure chamber formed by a flexible membrane, the substrate holder being configured to hold a substrate on the substrate holding surface and press the substrate against the polishing pad via pressure in the pressure chamber;

a substrate separation assisting device configured to eject a fluid to a contact portion between the substrate and the flexible membrane so as to release the substrate from the substrate holding surface;

a tilting device configured to tilt the substrate separation assisting device; and a controller configured to control operations of the tilting device and the substrate separation assisting device, the controller being configured to tilt the substrate separation assisting device in accordance with an amount of descent of the contact portion and then cause the substrate separation assisting device to eject the fluid to the contact portion.

5. The polishing apparatus according to claim 4, wherein the controller is configured to detect a minimum point of the pressure in the pressure chamber to thereby detect release of the substrate from the substrate holding surface.

6. The polishing apparatus according to claim 4, wherein the controller is configured to calculate the amount of descent of the contact portion from an amount of decrease in the pressure in the pressure chamber.

7. A method of polishing a substrate using a substrate holder having a substrate holding surface and a pressure chamber formed by a flexible membrane, said method comprising:

pressing the substrate against a polishing pad via pressure in the pressure chamber;

providing a relative movement between the substrate and the polishing pad to polish the substrate;

after polishing of the substrate, holding the substrate on the substrate holding surface;

transporting the substrate to a substrate transfer position;

vertically moving one of the substrate holder and a substrate separation assisting device in accordance with an amount of descent of a contact portion between the substrate and the flexible membrane; and ejecting a fluid from the substrate separation assisting device to the contact portion to release the substrate from the substrate holding surface.

8. The method according to claim 7, further comprising:
detecting a minimum point of the pressure in the pressure chamber to thereby detect release of the substrate from the substrate holding surface.

9. The method according to claim 7, further comprising:
calculating the amount of descent of the contact portion from an amount of decrease in the pressure in the pressure chamber.

10. A method of polishing a substrate using a substrate holder having a substrate holding surface and a pressure chamber formed by a flexible membrane, said method comprising:

pressing the substrate against a polishing pad via pressure in the pressure chamber;

providing a relative movement between the substrate and the polishing pad to polish the substrate;

after polishing of the substrate, holding the substrate on the substrate holding surface;

transporting the substrate to a substrate transfer position;

tilting a substrate separation assisting device in accordance with an amount of descent of a contact portion between the substrate and the flexible membrane; and ejecting a fluid from the substrate separation assisting device to the contact portion to release the substrate from the substrate holding surface.

11. The method according to claim 10, further comprising:
detecting a minimum point of the pressure in the pressure chamber to thereby detect that the substrate is released from the substrate holding surface.

12. The method according to claim 10, further comprising:
calculating the amount of descent of the contact portion from an amount of decrease in the pressure in the pressure chamber.

13. A polishing apparatus, comprising:
a polishing table for supporting a polishing pad;
a substrate holder having a substrate holding surface and a pressure chamber formed by a flexible membrane, the substrate holder being configured to hold a substrate on the substrate holding surface and press the substrate against the polishing pad via pressure in the pressure chamber; and
a substrate release detector configured to detect release of the substrate from the substrate holding surface based on a change in the pressure in the pressure chamber.

14. The polishing apparatus according to claim 13, wherein the substrate release detector is configured to detect a minimum point of the pressure in the pressure chamber to thereby detect release of the substrate from the substrate holding surface.

15. A method of polishing a substrate using a substrate holder having a substrate holding surface and a pressure chamber formed by a flexible membrane, said method comprising:

pressing the substrate against a polishing pad via pressure in the pressure chamber;

providing a relative movement between the substrate and the polishing pad to polish the substrate;

after polishing of the substrate, holding the substrate on the substrate holding surface;

transporting the substrate to a substrate transfer position;

monitoring a change in the pressure in the pressure chamber; and detecting release of the substrate from the substrate holding surface based on the change in the pressure in the pressure chamber.

16. The method according to claim 15, wherein the detecting the release of the substrate comprises detecting a minimum point of the pressure in the pressure chamber to thereby detect release of the substrate from the substrate holding surface.

17. A polishing apparatus, comprising:
a polishing table for supporting a polishing pad;
a substrate holder having a substrate holding surface and a pressure chamber formed by a flexible membrane, the substrate holder being configured to hold a substrate on the substrate holding surface and press the substrate against the polishing pad via pressure in the pressure chamber;
a substrate separation assisting device configured to eject a fluid to a contact portion between the substrate and the flexible membrane so as to release the substrate from the substrate holding surface;
a vertically-moving device configured to vertically move the substrate separation assisting device; and
a controller configured to control operations of the vertically-moving device and the substrate separation assisting device,
the controller being configured to cause the vertically-moving device to move the substrate separation assisting device vertically in accordance with an amount of descent of the contact portion and then cause the substrate separation assisting device to eject the fluid to the contact portion.

18. The polishing apparatus according to claim 17, wherein the controller is configured to detect a minimum point of the pressure in the pressure chamber to thereby detect release of the substrate from the substrate holding surface.

19. The polishing apparatus according to claim 17, wherein the controller is configured to calculate the amount of descent of the contact portion from an amount of decrease in the pressure in the pressure chamber.

* * * * *